United States Patent

Jan et al.

(10) Patent No.: US 9,490,054 B2
(45) Date of Patent: Nov. 8, 2016

(54) SEED LAYER FOR MULTILAYER MAGNETIC MATERIALS

(71) Applicant: Headway Technologies, Inc., Milpitas, CA (US)

(72) Inventors: Guenole Jan, San Jose, CA (US); Ru-Ying Tong, Los Gatos (CA)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/649,327

(22) Filed: Oct. 11, 2012

(65) Prior Publication Data

US 2014/0103469 A1    Apr. 17, 2014

(51) Int. Cl.

| H01L 29/82 | (2006.01) |
|---|---|
| H01F 10/30 | (2006.01) |
| H01F 10/32 | (2006.01) |
| H01L 43/08 | (2006.01) |
| H01L 43/12 | (2006.01) |
| H01L 43/10 | (2006.01) |
| H01F 41/30 | (2006.01) |
| G11C 11/16 | (2006.01) |
| H01F 10/12 | (2006.01) |

(52) U.S. Cl.
CPC .......... *H01F 10/30* (2013.01); *H01F 10/3286* (2013.01); *H01F 41/307* (2013.01); *H01L 43/08* (2013.01); *H01L 43/10* (2013.01); *H01L 43/12* (2013.01); *G11C 11/161* (2013.01); *H01F 10/123* (2013.01); *H01F 10/3272* (2013.01)

(58) Field of Classification Search
CPC ................................ H01L 43/08; H01L 43/10
USPC ........ 257/420–421; 365/148, 173; 360/324.2
See application file for complete search history.

(56) References Cited

U.S. PATENT DOCUMENTS

| 8,779,538 B2* | 7/2014 | Chen et al. ................ 257/427 |
|---|---|---|
| 2002/0008016 A1 | 1/2002 | Hayashi et al. |
| 2004/0087037 A1* | 5/2004 | Berg et al. ........................ 438/3 |
| 2004/0109280 A1* | 6/2004 | Moon et al. ............... 361/306.3 |
| 2008/0239591 A1* | 10/2008 | Fuji et al. ................ 360/324.12 |
| 2009/0080238 A1 | 3/2009 | Yoshikawa et al. |
| 2010/0035085 A1* | 2/2010 | Jung .................... G11B 5/7325 428/800 |

(Continued)

FOREIGN PATENT DOCUMENTS

WO    WO 2011/159422    12/2011

OTHER PUBLICATIONS

"Current-driven excitation of magnetic multilayers," Journal of Magnetism , and Magnetic Materials 159, L1-L7, Jun. 1996, Elsevier.
Co-pending US Patent HMG10-036, U.S. Appl. No. 13/068,398, filed May 10, 2011, "CoNi Multilayers with Improved Out-of-Plane Anisotropy for Magnetic Device Applications," by Guenole Jan, et al., 37 pgs.

(Continued)

*Primary Examiner* — John C Ingham
*Assistant Examiner* — Fredercik B Hargrove
(74) *Attorney, Agent, or Firm* — Saile Ackerman LLC; Stephen B. Ackerman

(57) ABSTRACT

A magnetic element is disclosed wherein a composite seed layer such as TaN/Mg enhances perpendicular magnetic anisotropy (PMA) in an overlying magnetic layer that may be a reference layer, free layer, or dipole layer. The first seed layer is selected from one or more of Ta, Zr, Nb, TaN, ZrN, NbN, and Ru. The second seed layer is selected from one or more of Mg, Sr, Ti, Al, V, Hf, B, and Si. A growth promoting layer made of NiCr or an alloy thereof may be inserted between the seed layer and magnetic layer. The magnetic element has thermal stability to at least 400° C.

13 Claims, 4 Drawing Sheets

(56) References Cited

U.S. PATENT DOCUMENTS

| | | |
|---|---|---|
| 2011/0045320 A1 | 2/2011 | Choi et al. |
| 2011/0064969 A1* | 3/2011 | Chen et al. ............... 428/800 |
| 2011/0096443 A1* | 4/2011 | Zhang et al. ............ 360/324.2 |
| 2011/0279921 A1 | 11/2011 | Zhang et al. |
| 2011/0303995 A1 | 12/2011 | Worledge |
| 2012/0063218 A1* | 3/2012 | Huai et al. ................ 365/171 |
| 2012/0068284 A1 | 3/2012 | Kitagawa et al. |
| 2012/0126905 A1 | 5/2012 | Zhang et al. |

OTHER PUBLICATIONS

Co-pending US Patent HMG11-012, U.S. Appl. No. 13/406,972, filed Feb. 28, 2012, "High Thermal Stability Reference Structure with Out-of-Plane Anisotropy for Magnetic Device Applications," by Yu-Jen Wang, et al., 36 pgs.

PCT Search Report, PCT/US2013/064243, Mailed: Apr. 9, 2014.

"Materials with perpendicular magnetic anisotropy for magnetic random access memory," by R. Sbiaa et al., Phys. Status Solidi RRL 5, No. 12, 413-419 (Oct. 4, 2011) / DOI 10.1002/pssr.201105420.

* cited by examiner

SEED LAYER FOR MULTILAYER MAGNETIC MATERIALS

RELATED PATENT APPLICATIONS

This application is related to the following: Ser. No. 13/068,398, filing date May 10, 2011; and Ser. No. 13/406,972, filing date Feb. 28, 2012.

TECHNICAL FIELD

The present disclosure relates to a magnetic element comprising a seed layer and growth promoting layer with thermal stability to at least 400° C., and that induce a strong (111) crystal structure in an overlying multilayer stack thereby improving perpendicular magnetic anisotropy (PMA) including Hc and Hk in the overlying stack.

BACKGROUND

Magnetoresistive Random Access Memory (MRAM), based on the integration of silicon CMOS with magnetic tunnel junction (MTJ) technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has stimulated considerable interest due to its potential application for spintronic devices such as spin-torque MRAM on a gigabit scale.

Both MRAM and STT-MRAM may have a MTJ element based on a tunneling magneto-resistance (TMR) effect wherein a stack of layers has a configuration in which two ferromagnetic layers are separated by a thin non-magnetic dielectric layer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, a ferromagnetic "reference" layer, a thin tunnel barrier layer, and a ferromagnetic "free" layer are sequentially formed on a bottom electrode. The free layer has a magnetic moment that is either parallel or anti-parallel to the magnetic moment in the reference layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and reference layers that determines the tunneling current and therefore the resistance of the tunneling junction. When a sense current is passed from the top electrode to the bottom electrode in a direction perpendicular to the MTJ layers, a lower resistance is detected when the magnetization directions of the free and reference layers are in a parallel state ("0" memory state) and a higher resistance is noted when they are in an anti-parallel state or "1" memory state.

As the size of MRAM cells decreases, the use of external magnetic fields generated by current carrying lines to switch the magnetic moment direction becomes problematic. Spin torque MRAM was developed to provide a robust magnetic switching margin by eliminating the half-select disturb issue. Compared with conventional MRAM, spin-torque MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high. The difference between a spin-torque MRAM and a conventional MRAM is only in the write operation mechanism. The read mechanism is the same.

For MRAM and spin-torque MRAM applications, it is often important to take advantage of PMA films with a large and tunable coercivity field (Hc) and anisotropy field (Hk). For example, PMA films may be used as a pinned layer, free layer, or dipole (offset compensation) layer in a MTJ element or in PMA media used in magnetic sensors, magnetic data storage, and in other spintronic devices. Furthermore, a critical requirement is that Hc, Hk, and other properties such as the magnetoresistive (MR) ratio do not deteriorate during processing at elevated temperatures up to 400° C. or higher. In some applications, it is also necessary to limit the overall thickness of the seed layer and other underlayers below the PMA layer to less than about 100 Angstroms, and use only materials that are compatible with device design and high temperature processing requirements.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement and have a low switching current density but also have no limit of cell aspect ratio. As a result, spin valve structures based on PMA are capable of scaling for higher packing density which is one of the key challenges for future MRAM applications and spintronic devices.

When the size of a memory cell is reduced, much larger magnetic anisotropy is required because the thermal stability factor is proportional to the volume of the memory cell. Generally, PMA materials have magnetic anisotropy larger than that of conventional in-plane soft magnetic materials such as NiFe or CoFeB. Thus, magnetic devices with PMA are advantageous for achieving a low switching current and high thermal stability.

Several PMA material systems have been proposed and utilized to date such as multilayers of Pt/Fe, Pd/Co, and Ni/Co, and ordered (e.g., L10 structures) as well as unordered alloys but there is still a need for improvement in Hc, Hk, temperature stability, and material compatibility. Among the PMA material systems studied, a Ni/Co multilayer is one of the more promising candidates because of its large potential Hc and Hk, good stability at high anneal temperatures, and potential compatibility with other materials used in magnetic devices. However, Ni/Co multilayers and the like typically require a thick seed layer to induce high PMA. Seed layers thicker than about 100 Angstroms will require thinning a different layer in the spin valve structure to maintain a certain minimum thickness for the MTJ element which can easily lead to performance degradation.

An improved seed layer is still needed that is thin enough to be compatible with spintronic devices, can induce greater PMA in overlying Co/Ni multilayer structures or CoFeB layers, and is compatible with the design and processing requirements of magnetic devices.

SUMMARY

One objective of the present disclosure is to provide an underlayer stack including a seed layer that will promote greater Hk and Hc in an overlying PMA layer than previously realized and with thermal stability up to 400° C. process temperatures.

A second objective of the present disclosure is to provide a material set for a high PMA structure according to the first objective that is compatible with other layers in the magnetic device and has an underlayer thickness of about 100 Angstroms or less.

According to one embodiment, these objectives are achieved with a magnetic element that is a MTJ with a bottom spin valve configuration in which, a seed layer, PMA reference layer, tunnel barrier, free layer, and capping layer are sequentially formed on a substrate. The seed layer (underlayer) is preferably a stack with a lower layer made of one or more of Ta, Zr, Nb, TaN, ZrN, NbN, or Ru, and an upper layer that is one or more of Mg, Sr, Al, Ti, V, Hf, B, Si, MgZr, or MgNb. However, the seed layer may also be a single layer made of an alloy that combines one element or alloy from the aforementioned materials that may serve as a lower layer and one element or alloy from the aforementioned materials that may serve as an upper layer. The seed layer structure induces a strong (111) texture in the overlying PMA reference layer and promotes a smooth surface on overlying layers. Preferably, the reference layer has a $Co_XFe_YNi_ZB_V$ composition where y>x+z, and v is from about 15 to 40 atomic % in the alloy. The tunnel barrier layer is preferably MgO.

In a second embodiment, the seed layer may be TaN, or a single layer alloy as described above, or a bilayer stack from the previous embodiment. The magnetic element further comprises a growth promoting layer between the seed layer and reference layer. The growth promoting layer is one of NiCr or NiCrM where M is one of Si, V, Fe, Mg, Zr, Nb, Ta, Ti, Cu and Mo that enhances PMA in the overlying reference layer and induces a strong (111) crystal structure therein. The growth promoting layer has a Cr content between 35 and 45 atomic %, and preferably 40 atomic %, and a thickness from 1 to 30 nm and preferably about 5 nm. In one aspect, the reference layer is a multilayer represented by $(Ni/Co)_n$ where n is the lamination number that is from 2 to 30, each Ni layer has a thickness of about 6 Angstroms, and each Co layer has a thickness of about 2.5 Angstroms. Optionally, Ni may be replaced by NiFe or NiCo, and Co may be replaced by CoFe in the laminated stack. In an alternative embodiment, the reference layer may be any face centered cubic (FCC) magnetic layer such as $(Co/Pt)_n$, $(Co/Pd)_n$, $(Fe/Pt)_n$, or $(Fe/Pd)_n$ having PMA. The magnetic element may also include a transitional layer made of CoFeB, CoFe, or Co between the (111) crystalline reference layer and the tunnel barrier layer that is preferably MgO with a (100) texture. The free layer may be comprised of CoFeB, CoFe, or a combination thereof. Thus, a high MR ratio is achieved together with enhanced PMA in the reference layer to enable greater thermal stability in the magnetic element.

According to a third embodiment, the reference layer in the second embodiment is modified to a synthetic antiferromagnetic (SAF) configuration wherein a non-magnetic coupling layer such as Ru is sandwiched between two laminated (Ni/Co) stacks, for example. To further enhance RKKY coupling, there may be a Co dusting layer on either side of the Ru coupling layer to give a $(Ni/Co)_n$/Co/Ru/Co/$(Ni/Co)_p$ configuration where p is the lamination number of the second laminated stack having PMA character. In a fourth embodiment, a non-magnetic layer such as Ta is inserted between the upper $(Ni/Co)_p$ portion of the SAF reference layer and a transition layer. As a result, the magnetic element has a stack represented by seed layer/ growth promoting layer/$(Ni/Co)_n$/Co/Ru/Co/$(Ni/Co)_p$/Ta/ CoFeB/Co/MgO/free layer/capping layer wherein CoFeB/ Co is the transition layer. In another embodiment, the magnetic element may have a top spin valve structure wherein a seed layer, PMA free layer, tunnel barrier, reference layer, and capping layer are sequentially formed on a substrate.

The present disclosure also encompasses an embodiment in which a dipole layer with a laminated PMA stack as defined in previous embodiments is used to provide an offset field to an adjacent free layer. The MTJ has a stack represented by seed layer/reference layer/tunnel barrier/free layer/underlayer/dipole layer/capping layer. The underlayer may have a seed layer/growth promoting layer configuration.

Once all the layers in the MTJ stack are laid down, a high temperature annealing of about 350° C. may be employed to increase the PMA within the laminated reference layer stack, free layer, or dipole layer.

DETAILED DESCRIPTION

Figure 1:
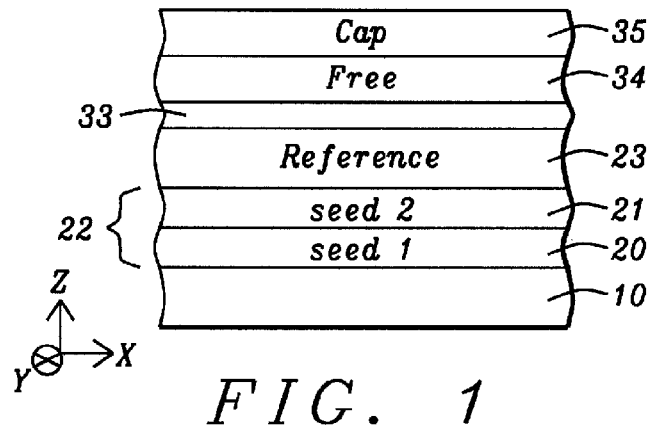
FIG. 1 is a cross-sectional view showing a magnetic element having a seed layer/PMA layer stack in a bottom spin valve configuration according to a first embodiment of the present disclosure.

The present disclosure is a magnetic element with an underlayer/PMA layer configuration wherein the underlayer is a seed layer or seed layer/growth promoting layer stack that induces a strong (111) crystalline structure in an overlying (Ni/Co)$_n$ multilayer or CoFeNiB layer thereby enhancing PMA in the overlying layer that may be a pinned layer, reference layer, dipole (offset compensation) layer, or free layer. The terms "seed layer" or "growth promoting layer" may be used interchangeably with the term "underlayer" in the exemplary embodiments, and (A1/A2), and (A2/A1)$_n$ are used interchangeably when referring to stack of "n" laminations wherein A1 is a first magnetic element or alloy, and A2 is a second magnetic element or alloy. Although only bottom and top spin valve structures are depicted in the drawings, the present disclosure also encompasses dual spin valves as appreciated by those skilled in the art. Moreover, the underlayer/PMA layer configuration described herein may be incorporated in one or more of a reference layer, free layer, dipole layer, or pinned layer in a MRAM, spin-torque-MRAM, domain wall motion device, and in other spintronic devices.

A key feature of the present disclosure is an underlayer/PMA layer stack wherein the underlayer enhances properties such as Hc and Hk in the overlying PMA layer. In particular, PMA character is enhanced in the PMA layer by the presence of an appropriate seed layer (underlayer) having a (111) texture. Ideally, the underlayer has a composition which is compatible with other materials in a magnetic element, is thermally stable to process temperatures up to 400° C., and is thin enough so as not to adversely affect other magnetic properties of the magnetic element.

Referring to FIG. 1, a first embodiment of the present disclosure is described with respect to a magnetic element with a bottom spin valve configuration that is formed on a substrate 10. The substrate 10 may be a bottom electrode layer, for example, made of Ta or other conductive layers. Each of the layers in the MTJ is formed in an (x, y) plane and with a thickness in a z-axis direction. Substrate 10 may be formed on a substructure (not shown) that includes dielectric and conductive layers as well as transistors and other devices. A key feature is the seed layer 22 formed on substrate 10. Preferably, the seed layer 22 is a composite with a lower layer 20 made of one or more of Ta, Zr, Nb, TaN, ZrN, NbN, and Ru with a thickness from 10 to 100 Angstroms. Lower layer 20 promotes a uniform thickness, (111) crystal structure, and smooth top surfaces in overlying layers. Top surface in this context is a surface facing away from substrate 10. Seed layer 22 also has an upper layer 21 with a thickness of 2 to 20 Angstroms and is made of one or more of Mg, Sr, Ti, Al, V, Hf, B, Si, or an alloy of Mg with Zr or Nb. The (111) texture of upper layer 21 is advantageously used to induce a (111) texture in an overlying magnetic layer 23. In the exemplary embodiment, magnetic layer 23 is shown as a reference layer but the present disclosure anticipates that the magnetic layer may be a free layer, dipole layer, or pinned layer rather than a reference layer as presented in subsequent embodiments.

In an alternative embodiment wherein seed layer 22 consists of a single layer, the seed layer has a thickness from 10 to 100 Angstroms and is preferably an alloy that includes one of Ta, Zr, Nb, TaN, ZrN, NbN, and Ru, and one of Mg, Sr, Ti, Al, V, Hf, B, Si, MgZr, and MgNb.

In one aspect, magnetic layer 23 is comprised of Co$_x$Fe$_y$Ni$_z$B$_v$ where y>x+z, v is from about 15 to 40 atomic % in the alloy, and v+x+y+z=100 atomic %. When z=0, this embodiment encompasses a CoFeB composition. The magnetic layer has a bottom surface that contacts seed layer 22 and an upper surface which adjoins tunnel barrier layer 33. In a preferred embodiment, the tunnel barrier layer is an oxide such as MgO that promotes interfacial perpendicular magnetic anisotropy in the magnetic layer 23. When the thickness of the magnetic layer is about 20 to 25 Angstroms or less, then the interfacial perpendicular magnetic anisotropy may be sufficiently large to overcome the in-plane magnetization and establish PMA within the magnetic layer. In this case, the seed layer 22 enhances the PMA property within magnetic layer 23.

The present disclosure also encompasses an embodiment wherein the magnetic layer 23 has intrinsic PMA and the seed layer is employed to enhance the PMA property in the overlying magnetic layer. For example, magnetic layer 23 may be comprised of (Ni/Co)$_n$, (CoFe/Ni)$_n$, Co/NiFe)$_n$, (Co/NiCo)$_n$, (CoFe/NiFe)$_n$, or (CoFe/NiCo)$_n$ laminates, for example, where n is between 2 and 30, and preferably 4 to 10. Furthermore, a face centered cubic (FCC) magnetic layer such as (Co/Pt)$_n$, Co/Pd)$_n$, (Fe/Pt)$_n$, or (Fe/Pd)$_n$ may be selected as the PMA magnetic layer. In yet another embodiment, the magnetic layer with PMA is an unordered alloy or a L10 ordered alloy of the form MT wherein M is Rh, Pd, Pt, Ir, or an alloy thereof, and T is Fe, Co, Ni or alloy thereof. Furthermore, the MT alloy may be doped with B to give a boron content up to 40 atomic %.

As mentioned previously, tunnel barrier layer 33 is preferably made of MgO although other oxides such as AlOx, TiOx, and ZnOx may be employed as the tunnel barrier. A MgO tunnel barrier layer may be fabricated by depositing a first Mg layer on the magnetic layer 23, then performing a natural oxidation (NOX) or radical oxidation (ROX) process, and finally depositing a second Mg layer on the oxidized first Mg layer. During a subsequent annealing process, the second Mg layer is oxidized to afford a substantially uniform MgO layer. If a low RA (resistance×area) value is desired, a NOX process is generally preferred or the thickness of the tunnel barrier 33 may be reduced as appreciated by those skilled in the art.

According to the exemplary embodiment, a free layer 34 is formed on the tunnel barrier layer 33 and may be made of one or more of CoFeB and CoFe, or another free layer material which produces a combination of high MR ratio, good switching property, and low magnetostriction. Those skilled in the art will recognize that the free layer 34 and magnetic layer 23 positions may be switched to form a top spin valve structure as explained later with regard to FIG. 5.

The uppermost layer in the spin valve stack is a capping layer 35 that may be a single layer of Ta or Ru, a composite with a Ru/Ta/Ru configuration, or other capping layer materials used in the art. According to one embodiment, the capping layer may be an oxide such as MgO, MgTaOx, or AlOx, or a composite with a lower oxide or nitride layer and an upper Ru or Ta layer. An oxide that serves as the capping layer or as the lower layer in the capping layer may be advantageously used to promote PMA in free layer 34 through an oxide/magnetic material interfacial interaction.

Figure 2:
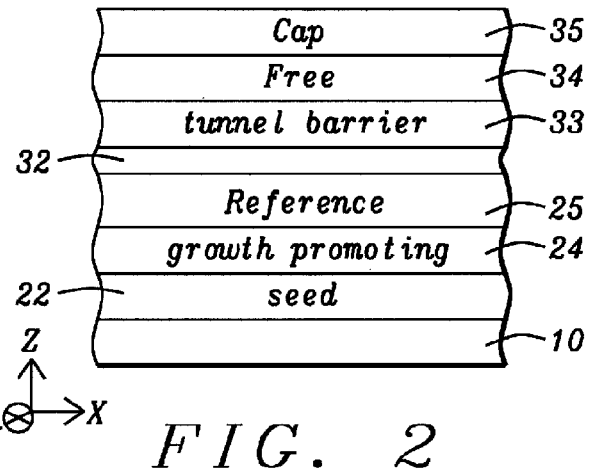
FIG. 2 is a cross-sectional view showing a magnetic element having a seed layer/growth promoting layer/PMA layer stack in a bottom spin valve configuration according to a second embodiment of the present disclosure.

In a second embodiment depicted in FIG. 2, a seed layer/growth promoting layer stack is employed to enhance PMA in an overlying reference layer that is a stack having a laminated structure with an (A1/A2)$_n$ configuration where n is the lamination number, A1 is a first magnetic element or alloy and A2 is a second magnetic element or alloy. Previously, we have fabricated $(A1/A2)_n$ reference layers that are grown on a NiCr or NiFeCr seed layer. However, NiCr based seed layers often generate a certain amount of roughness in overlying layers due to grain growth. Non-uniformity is an issue for magnetic multilayers such as $(Ni/Co)_n$ when they are combined with functional layers whose properties highly depend on the degree of roughness at various interfaces in a magnetic element. For example, a smooth top surface in a laminated reference layer promotes a more uniform top surface in subsequently deposited layers including a RKKY coupling layer and a second reference layer in a synthetic anti-ferromagnetic (SAF) design, and a smoother top surface in an overlying tunnel barrier layer.

We have surprisingly found that the combination of a TaN/Mg seed layer 22 and an overlying growth promoting layer 24 made of NiCr or a NiCr alloy generates enhanced PMA in a subsequently deposited laminated reference layer 25. The growth promoting layer has a thickness from 10 to 100 Angstroms. The NiCr alloy contains at least one element selected from Si, V, Fe, Mg, Zr, Nb, Ta, Ti, Cu, and Mo. The resulting magnetic element (MTJ) has high thermal stability to at least 400° C. and improved uniformity (low roughness) in the individual layers, especially in laminated reference layer 25, tunnel barrier 33, and free layer 34. In another aspect, the one or more materials selected for the seed layer are previously described in the first embodiment. Thus, a bilayer scheme with lower layer 20 and upper layer 21, or a single layer with a thickness from 10 to 100 Angstroms and made of an alloy of one element or alloy from lower layer 20 and one element or alloy from upper layer 21 may be employed as the seed layer 22 in the second embodiment.

Laminated reference layer 25 may be comprised of two metals, a metal and an alloy, or two alloys having an $(A1/A2)_n$ configuration where A1 is a first metal or alloy selected from one or more of Co, Ni, and Fe that may be doped with boron up to 50 atomic %, A2 is a second metal or alloy selected from one or more of Co, Fe, Ni, Ru, Si, Ir, Rh, V, Mg, NiCr, Pt, and Pd, where "n" is the number of laminates in the $(A1/A2)_n$ stack. It should be understood that the laminated $(A1/A2)_n$ stack has intrinsic PMA and the seed layer 22 is employed to enhance the PMA property. Thus, the reference layer 25 may be comprised of $(Ni/Co)_n$, $(CoFe/Ni)_n$, $Co/NiFe)_n$, $(Co/NiCo)_n$, $(CoFe/NiFe)_n$, or $(CoFe/NiCo)_n$ laminates, for example, where n is between 2 and 30, and preferably 4 to 10. Note that an $(A2/A1)_n$ configuration provides the same performance as an $(A1/A2)_n$ stack and is considered to be equivalent to an $(A1/A2)_n$ laminated stack for the purposes of this disclosure. The growth promoting layer/laminated PMA stack described herein may be deposited at room temperature or at an elevated temperature up to 450° C. and can be used as deposited or after an additional anneal. Alternatively, the reference layer may be any face centered cubic (FCC) magnetic layer having perpendicular magnetic anisotropy including but not limited to $(Co/Pt)_n$, $Co/Pd)_n$, $(Fe/Pt)_n$, and $(Fe/Pd)_n$.

Optionally, a transition layer 32 made of CoFeB, CoFe, Co or a combination thereof is provided between the reference layer and the tunnel barrier layer. According to one embodiment, PMA within transition layer 32 is achieved as a result of the interface with a metal oxide layer in tunnel barrier 33 that leads to a significant amount of interfacial perpendicular anisotropy. Moreover, the magnetic moments of layers 25, 32 are aligned in the same direction along the z-axis. Layer 32 serves as a transition layer between the (111) texture in laminated reference layer 25 and a (100) texture in tunnel barrier 33 and may also enhance the magnetoresistive (MR) ratio of the magnetic element. As the transition layer thickness becomes closer to 6 Angstroms, PMA character is maximized, and as layer 32 thickness approaches 14 Angstroms, MR ratio is increased. Therefore, the thickness of the transition layer may be adjusted between 6 and 14 Angstroms to tune both PMA magnitude and MR ratio. A Co transition layer is less susceptible to oxidation than a CoFe or CoFeB layer and preferably contacts the tunnel barrier layer when layer 32 has a CoFeB/Co or CoFe/Co configuration.

Free layer 34 and capping layer 35 are retained from the first embodiment. However, the free layer may have a laminated structure such as $(CoFe/Ni)_m$, $Co/NiFe)_m$, $(Co/NiCo)_m$, $(CoFe/NiFe)_m$, or $(CoFe/NiCo)_m$, for example, where m is a lamination number preferably between 4 and 10, and m≤n in the reference layer laminate. In an alternative embodiment, the free layer may have a CoFeB/IL/CoFeB configuration where IL is a non-magnetic insertion layer such as Ta that serves as a moment diluting layer.

Figure 3:
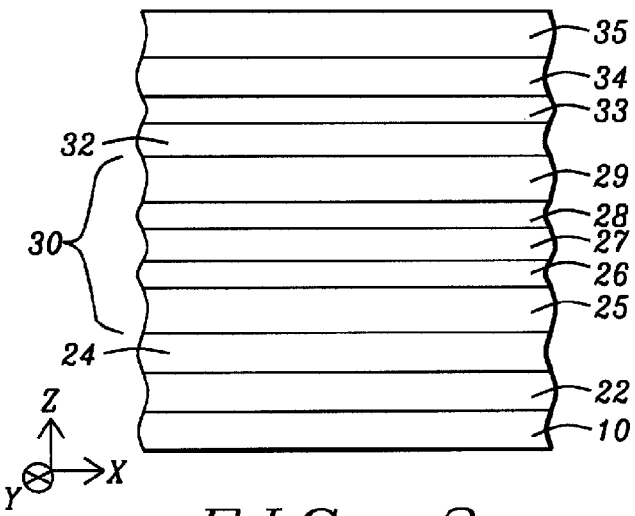
FIG. 3 is a cross-sectional view showing a magnetic element having a seed layer/growth promoting layer/PMA layer stack in a bottom spin valve configuration according to a third embodiment of the present disclosure.

In a third embodiment illustrated in FIG. 3, a composite reference layer 30 conforms to a synthetic anti-ferromagnetic (SAF) configuration wherein two laminated PMA stacks 25, 29 represented by $(A1/A2)_n$ and $(A1/A2)_p$, respectively, as described previously are separated by a non-magnetic spacer 27 thereby providing anti-ferromagnetic (RKKY) coupling between the two laminated stacks. Optionally, one or both of the PMA stacks may comprise a FCC laminate or an ordered L10 alloy as described earlier. The number of laminations "p" in the second laminated PMA stack 29 is between 2 and 30, and preferably from 4 to 10, and is not necessarily equal to "n" in the first laminated PMA stack 25. In this embodiment, the non-magnetic spacer is preferably Ru with a thickness of 3 to 20 angstroms. To further promote RKKY coupling and enhance Hc and Hk in the adjoining laminated PMA layers, a first dusting layer 26 such as Co with a thickness of 1 to 10 Angstroms may be inserted between laminated PMA stack 25 and spacer 27, and a second dusting layer 28 with a similar thickness may be inserted between spacer 27 and laminated PMA stack 29 to give a $(A1/A2)_n$/Co/Ru/Co/$(A1/A2)_p$ configuration for composite reference layer 30. Thus, the $(A1/A2)_n$ stack is considered equivalent to an AP2 layer and the $(A1/A2)_p$ stack functions like an AP1 layer in a conventional AP2/Ru/AP1 reference layer configuration.

Figure 4:
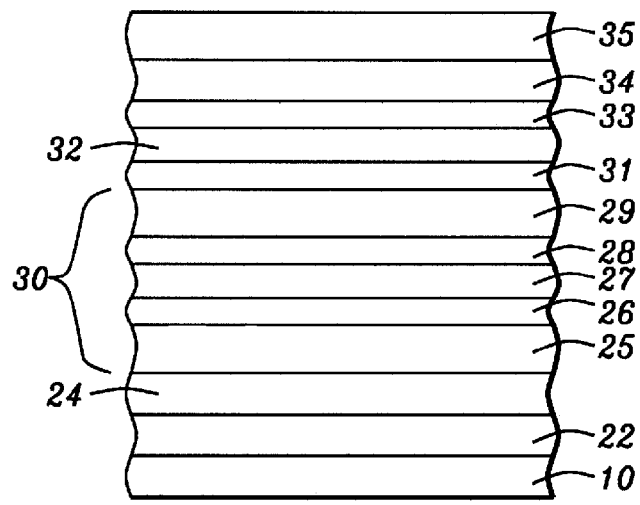
FIG. 4 is a cross-sectional view showing a magnetic element having a seed layer/growth promoting layer/PMA layer stack in a bottom spin valve configuration according to a fourth embodiment of the present disclosure.

In a fourth embodiment shown in FIG. 4, an insertion layer 31 such as Ta may be included between the laminated PMA stack 29 and transition layer 32 to prevent premature crystallization of an amorphous CoFeB transition layer before the tunnel barrier is deposited. Otherwise, all layers from the third embodiment are retained in the fourth embodiment. A Ta insertion layer is preferably about 0.5 to 3 Angstroms thick and more preferably 1.5 Angstroms thick. As a result, crystallization of an amorphous CoFeB transition layer during a subsequent annealing step is driven by the (100) MgO tunnel barrier and the upper portion of the CoFeB transition layer adjoining the tunnel barrier crystallizes in a (100) state to maximize the MR ratio in the MTJ. It should be understood that a lower portion of a CoFeB transition layer which adjoins the insertion layer will have a (111) crystal structure because of close proximity to the reference layer or may remain amorphous, but the thickness of this lower portion is believed to be less than the upper portion with a (100) texture.

Figure 5:
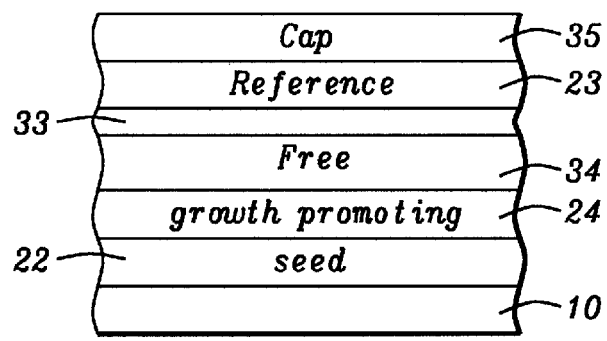
FIG. 5 is a cross-sectional view showing a magnetic element having a seed layer/growth promoting layer/PMA layer stack in a top spin valve configuration according to a fifth embodiment of the present disclosure.

Referring to FIG. 5, a fifth embodiment is depicted that shows a magnetic element wherein the seed layer/growth promoting layer stack of the present disclosure is employed to enhance PMA in an overlying free layer 34. In other words, the underlayer stack defined herein is not limited to enhancing PMA in an overlying reference layer but may be used to improve PMA in a free layer or dipole layer as well. Preferably, the magnetic element in this embodiment has a top spin valve structure in which a seed layer, growth promoting layer, free layer, tunnel barrier, reference layer, and a capping layer are sequentially formed on substrate 10. The seed layer 22 and growth promoting layer 24 have the same composition and function as described previously. Reference layer 23 was also described earlier with regard to FIG. 1. According to one embodiment, the free layer 34, tunnel barrier 33, and capping layer 35 may be made of the same material as described in previous embodiments. In other words, free layer 34 may be comprised of CoFeB, CoFe, or a combination thereof. However, the present disclosure also encompasses a free layer that is a laminated stack with PMA having a plurality "r" of (A1/A2) layers, or is a face centered cubic (FCC) magnetic layer having perpendicular magnetic anisotropy including but not limited to $(Co/Pt)_r$, $Co/Pd)_r$, $(Fe/Pt)_r$, or $(Fe/Pd)_r$, or is an ordered L10 alloy. In this case, lamination number "r" for the $(A1/A2)_r$ stack or the FCC laminated stack is from 1 to 10.

Figure 6:
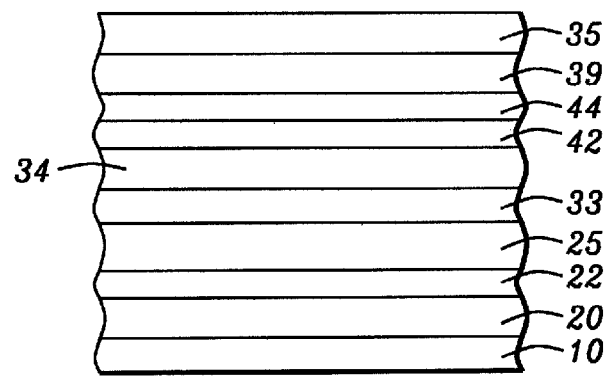
FIG. 6 is a cross-sectional view of a magnetic element according to a sixth embodiment wherein a dipole layer serves as an offset compensation layer.
Figure 7A:
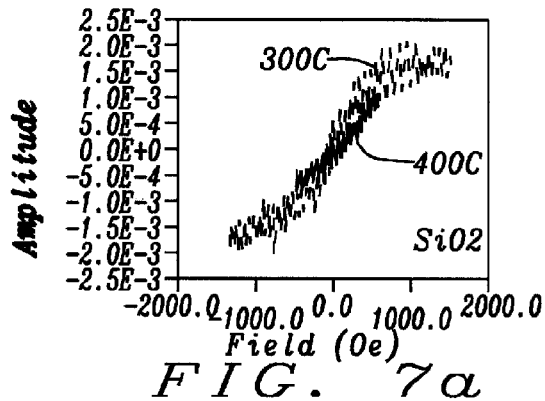
FIGS. 7a-7h are a series of graphs that illustrate magnetic properties measured perpendicular the film plane for CoFeB layers grown on different underlayers annealed at 300° C. (dashed line) and then post annealed at 400° C. (solid line).
Figure 7C:
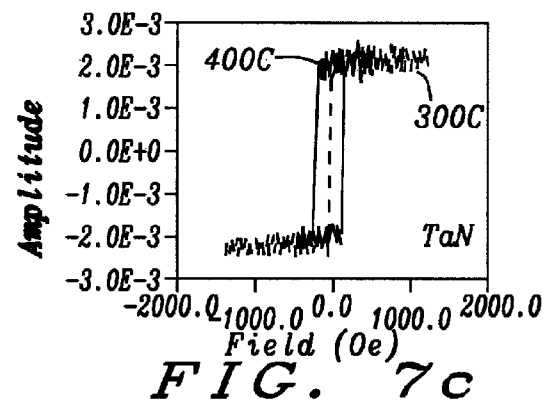
Figure 7E:
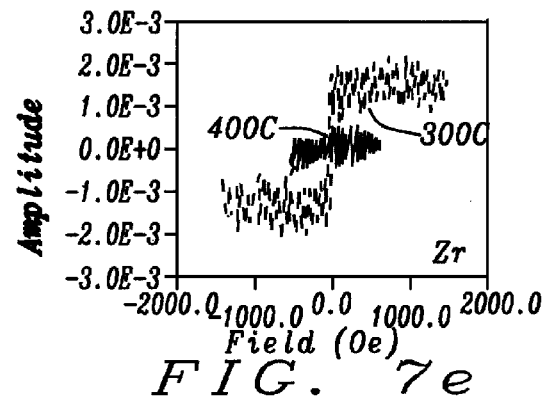
Figure 7G:
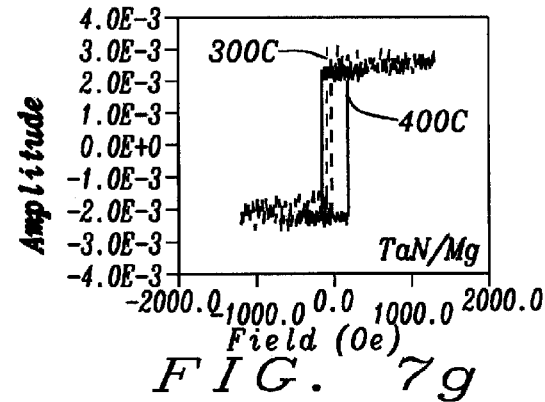
Figure 7B:
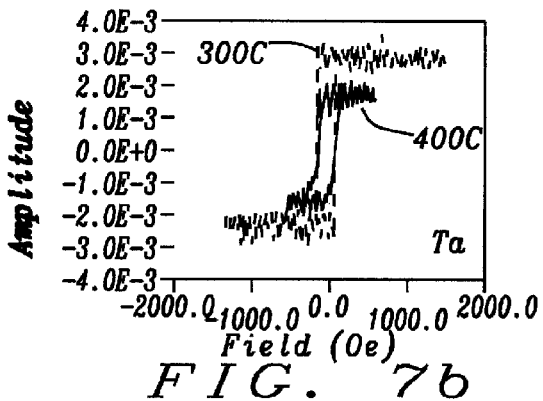
Figure 7D:
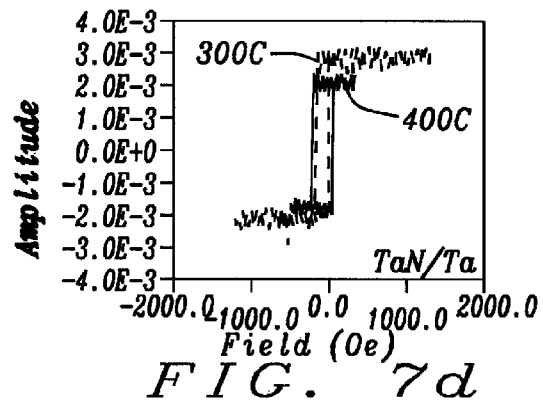
Figure 7F:
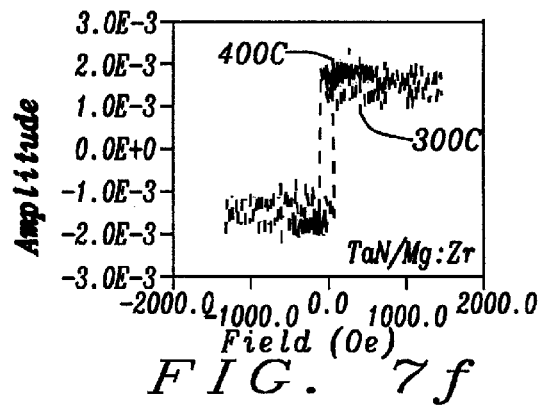
Figure 7H:
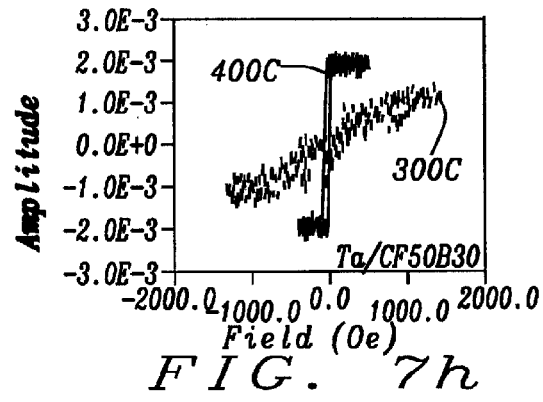

Referring to FIG. 6, a sixth embodiment of the present invention is illustrated and depicts a magnetic element having a bottom spin valve structure wherein the seed layer/growth promoting layer configuration serves as an underlayer for a dipole layer. The dipole layer reduces the offset of the minor switching loop of the free layer caused by a dipole field from the reference layer. Thus, the magnetic element structure of the second embodiment (FIG. 2) is modified by inserting a second seed layer 42, a second growth promoting layer 44, and the dipole layer 39 that are sequentially formed on a top surface of free layer 34. The second seed layer and second growth promoting layer may have the same composition as seed layer 22 and growth promoting layer 24, respectively, that were described in an earlier embodiment. Preferably, there is a thin reference layer 25 with a thickness from 5 to 15 Angstroms that is formed on a stack made of a lower first seed layer 20 and an upper second seed layer 21. A growth promoting layer (not shown) may be formed between the seed layer 22 and reference layer 25. Free layer 34 and capping layer 35 were previously described with regard to the first embodiment. In one aspect, a CoFeB/MgO/CoFeB reference layer/tunnel barrier/free layer stack may be employed to provide a high MR ratio. Optionally, reference layer 25 may be a laminated $(A1/A2)_n$ structure, or an ordered L10 alloy. In another aspect, a single laminated $(A1/A2)_n$ stack may be replaced by a composite reference layer 30 described in previous embodiments.

A key feature is the stack of layers formed between the free layer and capping layer. The second seed layer 42, preferably made of Ta, contacts a top surface of free layer 34 and getters oxygen from the free layer. A second growth promoting layer 44 contacts a bottom surface of dipole layer 39 wherein the dipole layer is preferably made of a material that exhibits intrinsic PMA such as $(A1/A2)_q$ laminated structure where q is from 2 to 30, or is a L10 ordered material as described earlier. In one aspect, free layer 34 may be sufficiently thin (6 to 15 Angstroms) to have significant interfacial perpendicular anisotropy that dominates an in-plane shape anisotropy field such that a magnetization perpendicular to the plane of the free layer is established. Interfacial perpendicular anisotropy is a result of the interface between a bottom surface of free layer and a top surface of tunnel barrier 33 which is preferably MgO. When the free layer has PMA, the magnetization directions of the free layer and dipole layer 39 are preferably aligned in the same direction.

It should be understood that the modifications described in the third and fourth embodiments may be included in the sixth embodiment. In other words, one or both of a transition layer 32 and Ta insertion layer 31 may be formed between the reference layer 25 (or 30) and the tunnel barrier layer 33.

All of the layers in the magnetic elements described herein may be formed in a sputter deposition system such as an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering to deposit an alloy from two targets made of single elements. Typically, the sputter deposition process involves an argon sputter gas with ultra-high vacuum and the targets are made of metal or alloys to be deposited on a substrate. All of the MTJ layers may be formed after a single pump down of the sputter system to enhance throughput.

The present disclosure also encompasses an annealing step after all layers in the magnetic element have been deposited. The anneal step comprises applying a temperature between 300° C. and 400° C. for a period of 30 minutes to 5 hours using a conventional oven, or for only a few seconds when a rapid thermal anneal oven is employed. No applied magnetic field is necessary during annealing.

Once all the layers in the magnetic elements are formed, the spin valve stack is patterned into an oval, circular, or other shapes from a top-down perspective along the z-axis by a well known photoresist patterning and reactive ion or ion beam etch transfer sequence. Thereafter, an insulation layer (not shown) may be deposited on the substrate 10 followed by a planarization step to make the insulation layer coplanar with the capping layer 35. Next, a top electrode (not shown) may be formed on the capping layer.

Example 1

An experiment was performed to demonstrate the advantage of a seed layer formed according to an embodiment of the present disclosure in improving magnetic properties in an overlying CoFeB reference layer. An unpatterned spin valve stack comprised of a seed layer, a 9 Angstrom thick $Co_{20}Fe_{50}B_{30}$ reference layer, MgO tunnel barrier layer, a 3 Angstrom thick CoFeB free layer, and a Ta20/Ru50 capping layer that were sequentially formed on a Si/SiO$_2$ substrate was fabricated. All layers were deposited at room temperature and annealed at 300° C. for 10 minutes and then annealed at 400° C. for 30 minutes. In each graph, the single layer or bilayer stack listed in the lower right corner refers to the seed layer composition. The single layers of Ta, TaN, and Zr are each 50 Angstroms thick. In a bilayer configuration, the lower TaN layer is 50 Angstroms thick, and the upper Mg, Mg:Zr (1:1) alloy, or Ta layer is 10 Angstroms thick. A Kerr magnetometer was used to generate the data shown in FIG. 7. A higher amplitude in a curve means a higher PMA is achieved. Thus, a TaN/Mg seed layer according to an embodiment described herein leads to higher PMA than a Ta seed layer after a final anneal of 400° C. With regard to the bilayer configurations, the TaN/Mg and TaN/Mg:Zr examples are considered to be more thermally stable than a TaN/Ta seed layer since the latter loses some amplitude at 400° C. compared with a 300° C. anneal while the seed layers of the present disclosure retain essentially all of their PMA amplitude after the anneal temperature is increased to 400° C. from 300° C.

Example 2

To further demonstrate the benefits of the present disclosure according to an embodiment where the composite seed layer promotes enhanced PMA in an overlying laminated PMA layer that serves as a reference layer, a stack of layers was fabricated according to the following configuration where the number following each layer is the thickness in Angstroms: Si/SiO$_2$/TaN50/Mg10/NiCr50/(Co2.5/Ni6)$_{10}$/Co4/Ru4/Co4/(Co2.5/Ni6)$_6$/Ta1.5/Co$_{20}$Fe$_{60}$B$_{20}$6/Co4/MgO/Co$_{20}$Fe$_{50}$B$_{30}$3/Ta20/Ru. In the aforementioned structure, Si/SiO$_2$ is the substrate, TaN/Mg is a composite seed layer, NiCr is the growth promoting layer, (Co/Ni)$_{10}$/Co/Ru/Co/(Co/Ni)$_6$ is a composite reference layer, Ta is an insertion layer, CoFeB/Co is the transitional magnetic layer adjoining a MgO tunnel barrier, Co$_{20}$Fe$_{50}$B$_{30}$ is place holder for a free layer since the layer is too thin to be magnetic, and Ta/Ru is the capping layer. A second stack of layers was fabricated according to a design previously practiced by the inventors and serves as a reference sample. The second stack differs from the first stack only in the underlayer structure where TaN/Mg/NiCr is replaced by Ta50/NiCr50.

Figure 8:
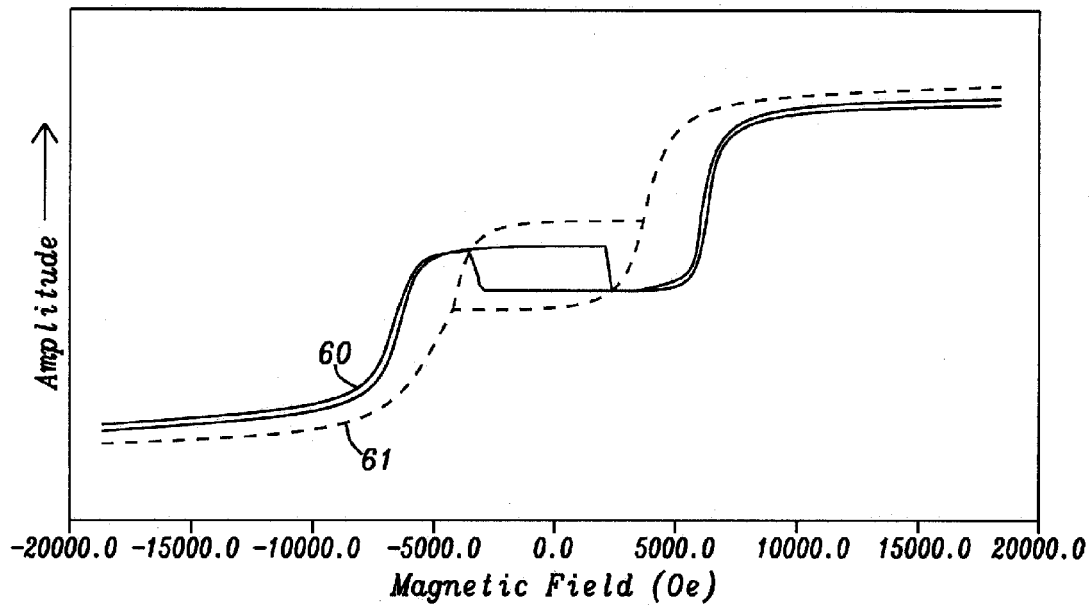
FIG. 8 is a plot illustrating magnetic properties measured perpendicular to the film plane for Co/Ni multilayers grown on a non-optimal underlayer (dashed line), and on an optimized underlayer (solid line) according to an embodiment of the present disclosure.

Referring to FIG. 8, a M-H loop measurement is illustrated for the two stacks of layers as described above that were annealed at 400° C. for 30 minutes. Magnetic properties are measured perpendicular to the film plane of the layers in each stack. Curve 60 for the first stack with a TaN/Mg/NiCr underlayer configuration shows a higher saturation field (>6000 Oe) than realized for the second stack (curve 61) where films are grown on the inadequate Ta/NiCr underlayer. Thus, higher PMA is realized in the reference layer and thermal stability to at least 400° C. is achieved when an improved underlayer according to an embodiment of the present disclosure is employed.

Example 3

The previous experiment was repeated with the same film stacks except the thickness of the Co$_{20}$Fe$_{50}$B$_{30}$ layer was increased to 12 Angstroms such that the film has a magnetic property and functions as a free layer. As a result, the first and second stacks are considered to be magnetic tunnel junctions (MTJs) suitable for spin-torque MRAM devices. The first stack or MTJ1 now has the following configuration: Si/SiO$_2$/TaN50/Mg10/NiCr50/(Co2.5/Ni6)$_{10}$/Co4/Ru4/Co4/(Co2.5/Ni6)$_6$/Ta1.5/Co$_{20}$Fe$_{60}$B$_{20}$6/Co4/MgO/Co$_{20}$Fe$_{50}$B$_{30}$12/Ta20/Ru. The second stack or MTJ2 has the same layers except for the underlayer structure which is Ta50/NiCr50 instead of TaN/Mg/NiCr in MTJ 1.

Figure 9:
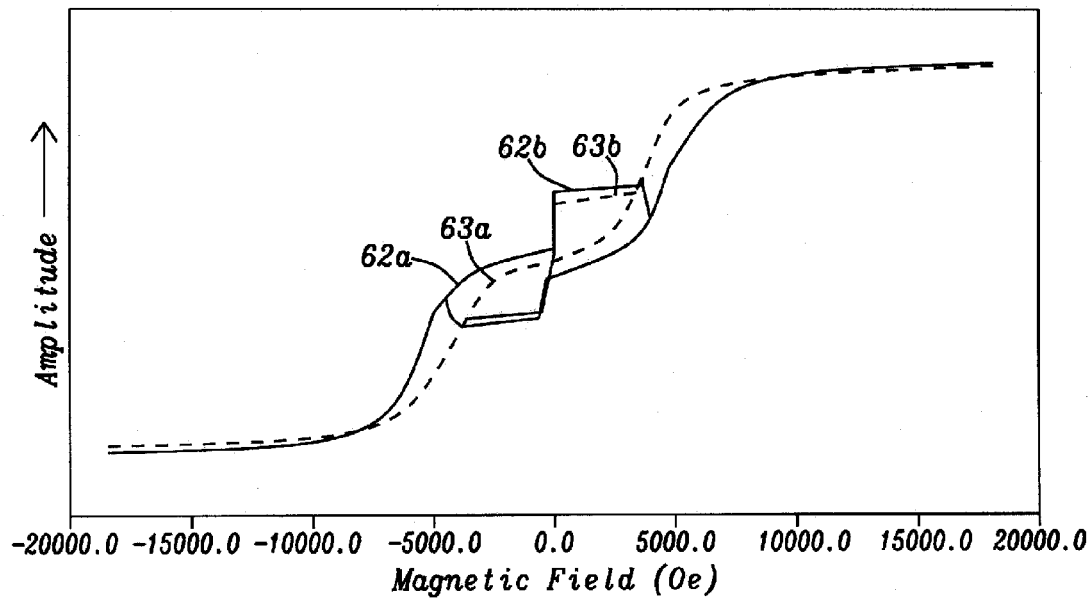
FIG. 9 is a plot illustrating M(H) loop measurements in a direction perpendicular to the film plane for a magnetic element grown on a less than optimal underlayer (dashed line) and on an optimized underlayer according to an embodiment described herein.

Referring to FIG. 9, a M-H loop measurement is illustrated for MTJ1 (dark solid line) and MTJ2 (dashed line) after they were annealed at 400° C. for 30 minutes. Magnetic properties are measured perpendicular to the film plane of the layers in each stack. Curve 62a for MTJ1 shows a higher saturation field (>5000 Oe) than realized for the MTJ2 (curve 63a) where films are grown on the inadequate Ta/NiCr underlayer. Thus, higher PMA is realized in the reference layer when an improved underlayer according to an embodiment of the present disclosure is employed. Thermal stability to at least 400° C. is also demonstrated. Note that steps 62b, 63b in the M-H loops indicate the free layer in each MTJ switches independently of the corresponding reference layer.

The disclosed underlayer structure with various embodiments including a single layer (alloy), a dual layer, or a single layer or dual layer with an overlying growth promoting layer offer improved magnetic properties in a PMA layer formed on the underlayer. Improvements include enhanced PMA, reduced roughness, and better compatibility with high temperature processing up to 400° C. or higher. The embodiments described herein may be employed with traditional PMA materials and also materials such as CoFeB that have in-plane magnetization but can be induced to have perpendicular magnetic anisotropy. Moreover, a first underlayer of the present disclosure may be used to enhance PMA in an overlying reference layer while a second underlayer as defined herein may be employed to enhance PMA in an overlying dipole layer within the same magnetic element.

While this disclosure has been particularly shown and described with reference to, the preferred embodiment thereof, it will be understood by those skilled in the art that various changes in form and details may be made without departing from the spirit and scope of this disclosure.

We claim:

1. A magnetic element, comprising:
   (a) a first seed layer consisting of one or more of Ta, Zr, Nb, TaN, ZrN, NbN, and Ru;
   (b) a second seed layer contacting a top surface of the first seed layer and consisting of one or more of Mg, Sr, MgZr, and MgNb, the second seed layer forms a first interface with a magnetic layer;
   (c) the magnetic layer; and
   (d) a tunnel barrier layer comprised of MgO or another oxide that is formed on the magnetic layer to give a composite seed layer/magnetic layer/tunnel barrier layer configuration.

2. The magnetic element of claim 1 wherein the magnetic layer has a Co$_x$Fe$_y$Ni$_z$B$_v$ composition where y>x+z, v is from about 15 to 40 atomic %, and v+x+y+z=100 atomic %.

3. The magnetic element of claim 1 wherein the magnetic layer has a (A1/A2)$_n$ laminated structure wherein A1 is a first metal or alloy selected from one or more of Co, Ni, and Fe, A2 is a second metal or alloy selected from one or more of Co, Fe, Ni, Ru, Si, V, Rh, Ir, Mg, NiCr, Pt, and Pd, and "n" is the number of laminates in the (A1/A2)$_n$ stack.

4. The magnetic element of claim 1 wherein the magnetic layer is an unordered alloy or an ordered L10 alloy with a MT composition wherein M is Rh, Pd, Pt, Ir, or an alloy thereof, and T is Fe, Co, Ni or alloy thereof.

5. The magnetic element of claim 1 wherein the first seed layer has a thickness from about 10 to 100 Angstroms, and the second seed layer has a thickness between about 2 and 20 Angstroms.

6. A magnetic element, comprising:
   (a) a seed layer comprising an alloy that is one of TaN, ZrN, or NbN, and one of Mg, MgZr, or MgNb, the seed layer forms a first interface with a magnetic layer; and
   (b) the magnetic layer that has a Co$_x$Fe$_y$Ni$_z$B$_v$ composition where y>x+z, v is from about 15 to 40 atomic %, and v+x+y+z=100 atomic %; and
   (c) a tunnel barrier layer comprised of MgO or another oxide that induces interfacial perpendicular anisotropy in the magnetic layer at a second interface with the magnetic layer, the aforementioned layers form a seed layer/magnetic layer/tunnel barrier stack.

7. A magnetic element, comprising:
   (a) a first seed layer comprising one or more of ZrN, and NbN;

(b) a second seed layer consisting of Ti or Hf that contacts a top surface of the first seed layer, the second seed layer forms a first interface with a magnetic layer;

(c) the magnetic layer; and (d) a tunnel barrier layer comprised of MgO or another oxide that is formed on the magnetic layer to give a composite seed layer/magnetic layer/tunnel barrier layer configuration.

8. The magnetic element of claim 7 wherein the magnetic layer has a $Co_xFe_yNi_zB_v$ composition where y>x+z, v is from about 15 to 40 atomic %, and v+x+y+z=100 atomic %.

9. The magnetic element of claim 7 wherein the magnetic layer has a $(A1/A2)_n$ laminated structure wherein A1 is a first metal or alloy selected from one or more of Co, Ni, and Fe, A2 is a second metal or alloy selected from one or more of Co, Fe, Ni, Ru, Si, V, Rh, Ir, Mg, NiCr, Pt, and Pd, and "n" is the number of laminates in the $(A1/A2)_n$ stack.

10. The magnetic element of claim 7 wherein the magnetic layer is an unordered alloy or an ordered L10 alloy with a MT composition wherein M is Rh, Pd, Pt, Ir, or an alloy thereof, and T is Fe, Co, Ni or alloy thereof.

11. The magnetic element of claim 7 wherein the first seed layer has a thickness from about 10 to 100 Angstroms, and the second seed layer has a thickness between about 2 and 20 Angstroms.

12. A magnetic element, comprising:

(a) a seed layer that is an alloy consisting of Sr and one of Ta, Zr, Nb, TaN, ZrN, and NbN, the seed layer forms a first interface with a magnetic layer and enhances perpendicular magnetic anisotropy (PMA) in the magnetic layer; and (b) the magnetic layer comprising at least one of Fe, Co, or Ni; and (c) a tunnel barrier layer comprised of MgO or another metal oxide that induces interfacial perpendicular anisotropy in the magnetic layer at a second interface with the magnetic layer, the aforementioned layers form a seed layer/magnetic layer/tunnel barrier stack.

13. A magnetic element, comprising:

(a) a seed layer comprising an alloy that is one of ZrN, or NbN, and one of Ti or Hf, the seed layer forms a first interface with a magnetic layer; and (b) the magnetic layer that has a $Co_xFe_yNi_zB_v$ composition where y>x+z, v is from about 15 to 40 atomic %, and v+x+y+z=100 atomic %; and (c) a tunnel barrier layer comprised of MgO or another oxide that induces interfacial perpendicular anisotropy in the magnetic layer at a second interface with the magnetic layer, the aforementioned layers form a seed layer/magnetic layer/tunnel barrier stack.

* * * * *